(12) United States Patent
Andre et al.

(10) Patent No.: US 9,575,125 B1
(45) Date of Patent: Feb. 21, 2017

(54) MEMORY DEVICE WITH REDUCED TEST TIME

(71) Applicant: Everspin Technologies, Inc., Chandler, AZ (US)

(72) Inventors: Thomas Andre, Austin, TX (US); Syed M. Alam, Austin, TX (US); William Meadows, Dripping Springs, TX (US)

(73) Assignee: Everspin Technologies, Inc., Chandler, AZ (US)

( * ) Notice: Subject to any disclaimer, the term of this patent is extended or adjusted under 35 U.S.C. 154(b) by 252 days.

(21) Appl. No.: 14/049,543

(22) Filed: Oct. 9, 2013

Related U.S. Application Data

(60) Provisional application No. 61/712,584, filed on Oct. 11, 2012, provisional application No. 61/793,654, filed on Mar. 15, 2013.

(51) Int. Cl.
*G01R 31/3193* (2006.01)
*G11C 29/10* (2006.01)

(52) U.S. Cl.
CPC ........... *G01R 31/3193* (2013.01); *G11C 29/10* (2013.01)

(58) Field of Classification Search
CPC .................................................. G01R 31/3193
See application file for complete search history.

(56) References Cited

U.S. PATENT DOCUMENTS

| 4,980,888 | A  | * | 12/1990 | Bruce     | G11C 29/42  |
|           |    |   |         |           | 714/718     |
| 5,903,582 | A  | * | 5/1999  | Miyazaki  | G06F 11/1008|
|           |    |   |         |           | 365/201     |
| 6,009,547 | A  | * | 12/1999 | Jaquette  | G06F 11/10  |
|           |    |   |         |           | 710/52      |
| 6,092,223 | A  | * | 7/2000  | Ahn       | G11C 29/835 |
|           |    |   |         |           | 365/185.3   |
| 6,304,989 | B1 | * | 10/2001 | Kraus     | G11C 29/44  |
|           |    |   |         |           | 714/718     |
| 6,321,353 | B2 | * | 11/2001 | Debenham  | H04B 17/00  |
|           |    |   |         |           | 714/724     |
| 6,550,023 | B1 | * | 4/2003  | Brauch    | G11C 29/40  |
|           |    |   |         |           | 714/42      |
| 7,302,622 | B2 | * | 11/2007 | Beer      | G11C 29/38  |
|           |    |   |         |           | 714/718     |
| 8,055,978 | B2 | * | 11/2011 | Kim       | G06F 11/073 |
|           |    |   |         |           | 714/769     |

(Continued)

OTHER PUBLICATIONS

Wicker, Stephen. "Error Control Systems for Digital Communication and Storage". Upper Saddle River: Prentice Hall, 1995.*

*Primary Examiner* — Steve Nguyen
(74) *Attorney, Agent, or Firm* — Lee & Hayes, PLLC

(57) ABSTRACT

In some examples, a memory device generates and exposes parity/difference information to a test system to reduce overall test time. The parity/difference information may be generated based on parity bits read from the memory device and parity bits produced from data bits stored in the memory device. In some cases, the parity/difference information may be compared to an expected parity/difference to determine a number of correctable errors which occurred during testing, while the data bits may be compared to expected data to determine a number of uncorrectable errors which occurred during testing.

20 Claims, 10 Drawing Sheets

(56) References Cited

U.S. PATENT DOCUMENTS

| | | | |
|---|---|---|---|
| 8,560,932 B2* | 10/2013 | Kleihorst | G01R 31/31921 714/736 |
| 8,839,054 B2* | 9/2014 | Braceras | G11C 29/822 714/710 |
| 2006/0053361 A1* | 3/2006 | Kim | G11C 29/42 714/766 |
| 2006/0156192 A1* | 7/2006 | Nakamura | G11C 29/42 714/763 |
| 2009/0132876 A1* | 5/2009 | Freking | G06F 11/106 714/723 |

* cited by examiner

MEMORY DEVICE WITH REDUCED TEST TIME

RELATED APPLICATION

This application claims priority to U.S. Provisional Application No. 61/712,584 to Andre et al., entitled "Method of Test Time Reduction Using ECC Error Detection Circuitry," filed Oct. 11, 2012 and claims priority to U.S. Provisional Application No. 61/793,654 to Andre et al., entitled "Method of Measuring and Binning Soft and Hard Fails," filed Mar. 15, 2013, the contents of both of which are incorporated herein by reference.

BACKGROUND

Some types of memory devices, such as magnetic memories, may experience inherent random errors during operation. These errors are expected and can be corrected during operation. In many cases, an error rate sufficiently high to exhibit errors within less than a second of operation without the use of correction may be corrected during operation with a resulting error rate that is sufficiently low to guarantee months or years of continuous error free operation. For this reason, testing of memory devices to guarantee an acceptable error rate during operation is performed with correction disabled. Since error correction typically requires additional memory cells to store parity information, the testing with correction disabled may require a special mode of operation to access all memory cells. In addition, the circuitry performing the correction must be verified during testing, therefore, testing of at least a portion of the memory must be performed in a second mode of operation with error correction enabled.

When testing magnetic memory devices, the number of correctable errors that occur may be important in determining the viability of the specific device. However, some test systems or services may classify a device as passing or failing based on the existence of a single error and are not easily configured to count or classify devices based on the number and types of errors that occur without adding significant time and cost.

BRIEF DESCRIPTION OF THE DRAWINGS

The detailed description is described with reference to the accompanying figures. In the figures, the left-most digit(s) of a reference number identifies the figure in which the reference number first appears. The use of the same reference numbers in different figures indicates similar or identical components or features.

DETAILED DESCRIPTION

Figure 1:
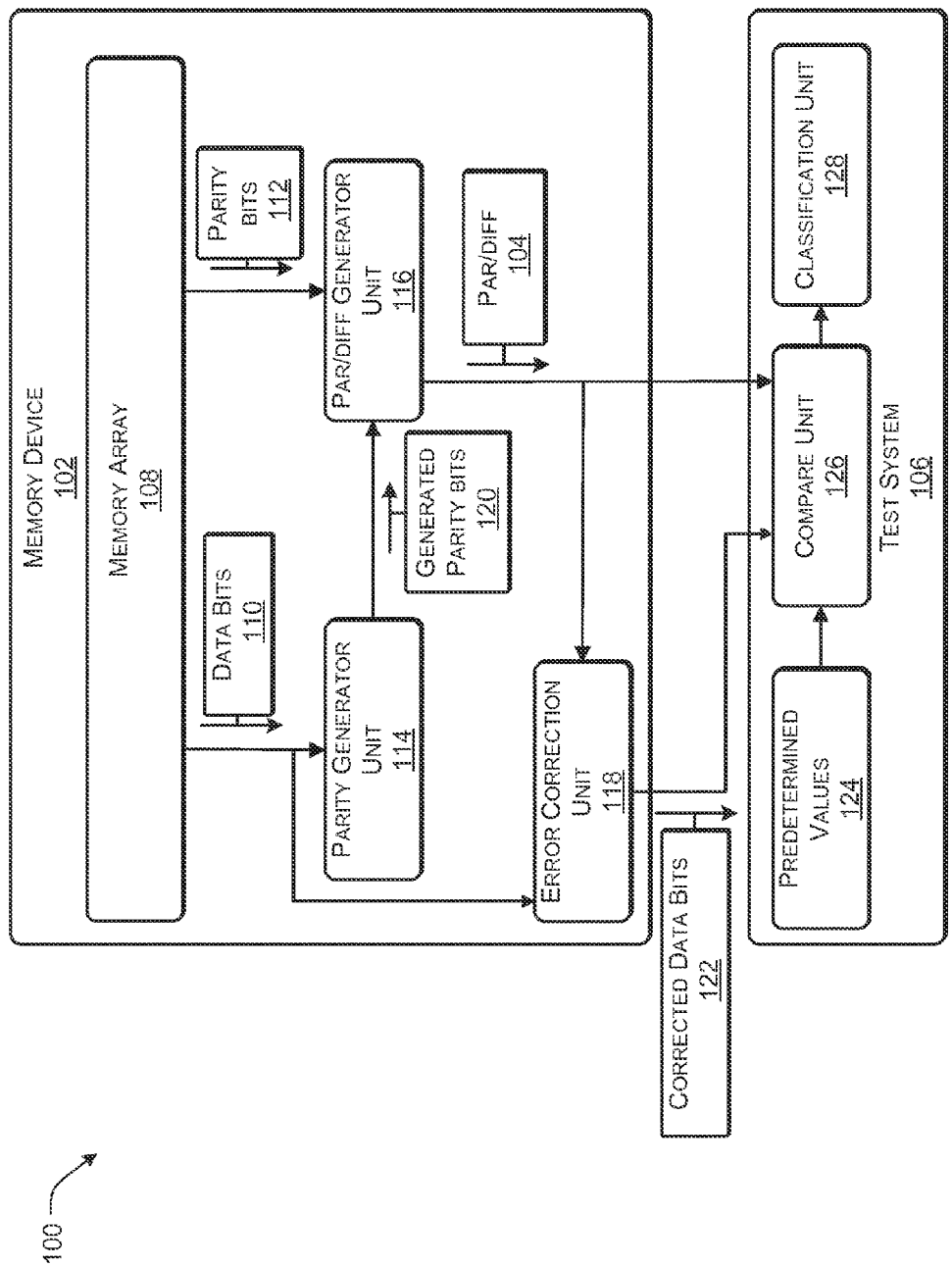
FIG. 1 illustrates an example architecture that includes a memory device, which exposes parity/difference information to a test system for improved testing according to some implementations.

This disclosure includes techniques and implementations to improve testing of memory devices. In some examples, a memory device may expose parity/difference information related to memory reads and writes to a test system in order to improve the speed and accuracy of memory device testing. In some implementations, the memory device is equipped with a built-in test system to further improve the speed and accuracy of the testing process. In some particular implementations, the memory device may be configured to utilize the parity/difference information to correct expected errors to also improve the quality of the memory device during operation.

In general, some types of memories (e.g., magnetic memories) have some number of inherent errors related to reading or writing data, which are expected and may be corrected by the memory device. However, if the error rate without correction is too high, the resulting error rate after correction may not meet the product requirements. Therefore, memories are tested with error correction disabled. Additionally, the correction circuitry must be verified at test, requiring testing of at least a portion of the memory in a second mode of operation with error correction enabled. In some cases, the memory may be tested first with correction enabled to quickly identify bad devices with uncorrectable errors. When testing with error correction turned on, the resulting data read from the device after the test is complete is compared to a test pattern to determine if any uncorrectable errors occurred (e.g., an error that was not corrected by the error correction built-into the memory device). If the data read from the device and the test pattern do not match, an uncorrectable error occurred and the device has permanently failed and may be discarded. Otherwise, if the data read from the device and the test pattern match, no errors have occurred.

However, if no uncorrectable errors are detected while testing with correction enabled, it does not necessarily mean that no errors occurred. Therefore, additional testing may be performed on the memory device with the error correction turned off. The number of errors that occur when testing with correction disabled is a relative indication of the error rate expected during operation with correction enabled. In some cases, if more than a threshold number of errors occur, the device may be discarded to ensure a high quality product. In some cases, the threshold may be set to reject any part with one or more errors, which may result in parts that meet the product requirement being rejected and therefore excess yield loss.

To perform error correction, the memory devices as described herein are configured with a number of parity bits for every data block. The parity bits may be read from the memory, together with the corresponding data bits. Parity information may be calculated using the data bits and the results compared to the parity bit values read from the memory to generate parity/difference information. This parity/difference information may then be used to perform error correction, as each correctable error will correspond to a unique parity/difference information result. The parity/difference information may then be exposed or otherwise provided to a test system or process to reduce the overall number of test runs performed on the device.

The parity/difference information may be a multi-dimensional array or table, which when analyzed may provide information related to the location and number of errors in the data bits or the parity bits. For example, in one implementation, the parity/difference information may be a two-dimensional array generated by comparing parity bits created from the data bits with the parity bits read from the memory. For instance, in one particular implementation, the parity bits generated from the data bits may be XORed with the parity bits read from the memory to generate the parity/difference information. Once the parity/difference information is generated, the parity/difference information may be provided to an external test system or an internal built-in test system to bin or classify the device as passing (i.e., usable) or failing (i.e., unusable). Further, in some examples, the parity/difference information may be provided to an error correction unit for use during normal operations.

In an example scenario, the parity/difference information may be used to reduce the amount of time necessary to perform a test on the memory device. For instance, the parity/difference information of a data block is typically smaller than the data block itself. Therefore, by configuring the memory device to compute and expose the parity/difference information to the test system, the test system may compare the parity/difference information to an expected parity/difference to determine if an error occurred without actually reading each of the data bits from memory. In this manner, the amount of data read by the test system and the number of comparisons made by the test system may be reduced for each test run performed on the device.

In another example scenario, the parity/difference information may be used to reduce the number of test runs performed on each memory device. As discussed above, when testing some types of memory devices (such as magnetic memories) the test system runs tests for each device in at least two modes of operation, the first with error correction enabled to verify the correction circuitry and determine if any uncorrectable errors occurred, and the second with error correction disabled to verify the device exhibits less than a threshold of correctable errors. However, by exposing the parity/difference information, both the correctable and uncorrectable errors may be determined from a single test with the error correction turned on. For instance, the uncorrectable errors may be determined by comparing the resulting data to a test pattern. The correctable errors may be identified by use of the parity/difference information generated during the same mode of operation, rather than during a test in a second mode of operation. For example, the test system may compare the parity/difference information to an expected parity/difference to determine if a correctable error (e.g., an error corrected by the error correction of the memory device) occurred, since the parity/difference information is generated before the error correction is applied.

FIG. 1 illustrates an example architecture 100 that includes a memory device 102, which exposes parity/difference information 104 to a test system 106 for improved testing according to some implementations. Generally, the memory device 102 includes one or more memory arrays 108 for storing data and circuitry for generating, comparing, and exposing parity/difference information 104 to a test system 106. In the illustrated example, the test system 106 is shown separate from the memory device 102. However, in some implementations, the test system 106 may be combined with the memory device 102, such as when the memory device 102 includes a built-in test system.

The memory device 102 is an example of tangible non-transitory computer storage media and may include volatile and nonvolatile memory and/or removable and non-removable media implemented in any type of technology for storage of information such as computer-readable instructions or modules, data structures, program modules or other data. Such computer-readable media may include, but is not limited to, RAM, ROM, EEPROM, flash memory or other computer-readable media technology, solid state storage, magnetic disk storage, RAID storage systems, storage arrays, network attached storage, storage area networks, cloud storage, or any other medium that can be used to store information and which can be accessed by a processors.

The memory array 108 is configured to store data blocks comprising both data bits 110 and parity bits 112 (or check bits) associated with the data bits 110. The data bits 110 contain the data, which is intended to be read from the memory array 108. The parity bits 112 are bits that are added to the end of the data block following the data bits 110 to determine whether an error has occurred during a read or write operation. In the illustrated example, the memory device 102 is configured to read and write both the data bits 110 and the parity bits 112 during testing to aid in determining the usability of the memory device 102.

The memory device 102 also includes a parity generator unit 114, a parity/difference (par/diff) generator unit 116 and an error correction unit 118. The parity generator unit 114 is configured to, during an access operation, read the data bits 110 from the memory array 108 and to generate additional parity bits 120 from the data bits 110. The generated parity bits 120 are similar to parity bits 112 read from the memory array 108 but are generated from the data bits 110 instead of accessed directly from the memory array 108.

The parity/difference generator unit 116 reads the parity bits 112 from the memory array 108 and receives the generated parity bits 120 from the parity generator unit 114. The parity/difference generator unit 116 compares the parity bits 112 read from the memory array 108 with the generated parity bits 120 to produce the parity/difference information 104. For example, the parity/difference generator unit 116 may perform a series of exclusive OR operations on the generated parity bits 120 and the parity bits 112 read from the memory array 108 to produce the parity/difference information 104. As discussed above, the parity/difference information 104 may be a multi-dimensional array or table, which provides information related to the number of errors and the identification of the data bits 110 or parity bits 112 containing the errors.

The error correction unit 118 receives the data bits 110, as well as, the parity/difference information 104 from the parity/difference generator unit 116. In some implementations, the error correction unit 118 may also receive the parity bits 112 read from the memory array 108. In general, the error correction unit 118 may be able to identify if an error is present in the data bits 110 or the parity bits 112 and to correct the error before the read or write operation is completed. For instance, in response to detecting an error, the error correction unit 118 may generate corrected data bits 122 by flipping one or more of the data bits 110 based on the parity/difference information 104. In some examples, the error correction unit 118 may perform single error correction, while in other examples, the error correction unit 118 may be configured to correct for multiple errors, such as by implementing double error correction or multi-bit error correction.

The test system 106, generally, determines the usability of the memory device 102 by running a series of test reads and/or writes into the memory array 108 of the memory device 102 and comparing the resulting data to one or more stored predetermined values 124. The predetermined values 124 are, typically, the expected value of the data bits 110 or the expected parity/difference after a read from the memory array 108. The read from the memory array 108 may be in a series of reads and/or writes performed by the memory device 102. In some implementations, the predetermined values 124 may include the expected value of the parity bits 112. In general, the test system 106 determines the usability by either passing or failing the memory device 102.

The test system 106 includes a compare unit 126, which is configured to receive the parity/difference information 104 and/or the corrected data bits 122 from the memory device 102 and to compare the parity/difference information 104 and/or the corrected data bits 122 to the predetermined values 124. The predetermined values 124 may either be read from an external source or from memory internal to the test system 106. For example, the compare unit 126 may compare the corrected data bits 122 read from the memory array 108 to the predetermined values 124 and the parity/difference information 104 to an expected parity/difference. By comparing the parity/difference information 104 in lieu of or in addition to the corrected data bits 122, the number of bits retrieved from the memory device 102 and the number of comparisons made by the compare unit 126 may be partially reduced, resulting in reduced test time for each memory device 102. For example, typically, the test system 106 compares each of the corrected data bits 122 of a data block to the predetermined values 124. However, only a limited number of bits may be accessed from the memory device 102 at any one time. Therefore, to compare all of the corrected data bits 122, multiple accesses are performed. By generating and exposing the parity/difference information 104 to the test system 106, the number of accesses preformed by the test system 106 may be reduced. For instance, in some implementations, the parity/difference information 104 may be retrieved from the memory device 102 and compared with the predetermined values 124 (i.e., the expected parity/difference information) using only a single memory access.

The classification unit 128 is configured to pass or fail the memory device 102 based on the results of the compare unit 126. For example, if the parity/difference information 104 matches the predetermined values 124, the memory device 102 passes and may be shipped. However, if the parity/ difference information 104 does not match the predetermined values 124, the memory device 102 fails and may be discarded or disposed of.

In the illustrated example, the test system 106 is shown as an external test system, which may be releasably connected to the memory device 102 during testing of the memory device 102. However, in other implementations, the test system 106 may be an internal built-in test system. In these implementations, the test system 106, the compare unit 126 and the classification unit 128 are incorporated into the memory device 102 and the classification unit 128 is configured to output a pass signal or a fail signal for the device 102 to an external system after testing is complete.

Figure 2:
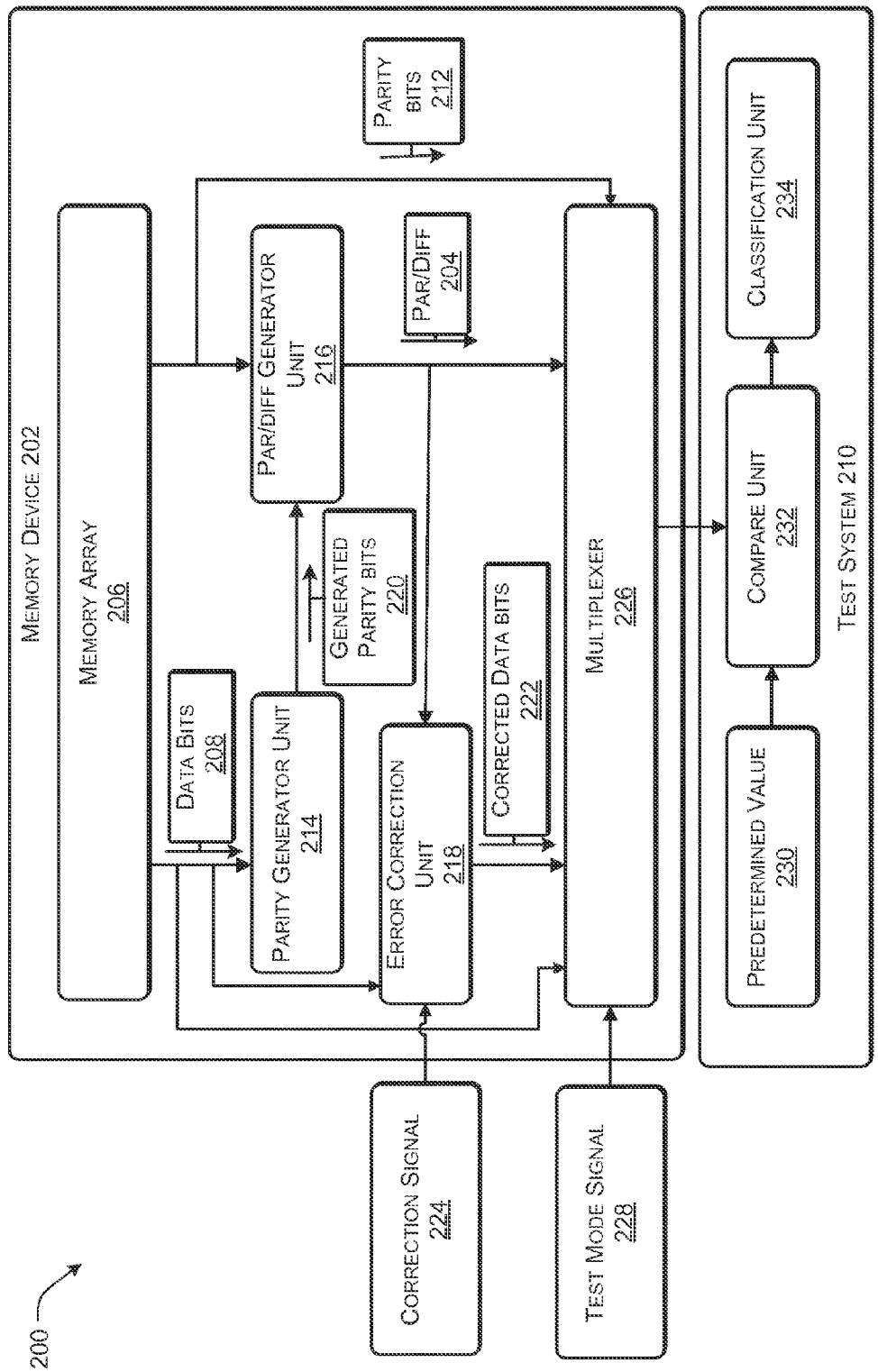
FIG. 2 illustrates another example architecture that includes a memory device, which exposes parity/difference information to a test system for improved testing according to some implementations.

FIG. 1 provides one example architecture in which test time for a memory device may be improved. FIG. 2 provides a second example architecture for improving test time of a memory device in which additional data and/or information may be exposed to the test system after each test.

FIG. 2 illustrates an example architecture 200 that includes a memory device 202, which exposes parity/difference information 204 to a test system 210 for improved testing according to some implementations. Generally, the memory device 202 includes one or more memory arrays 206 for storing data in addition to circuitry for generating, comparing, and exposing parity/difference information 204, data bits 208, parity bits 212, and/or a combination therefore to a test system 210.

The memory array 206 is configured to store data blocks comprising both data bits 208 and parity bits 212 associated with the data bits 208. As discussed above with respect to FIG. 1, the data bits 208 contain the data, which is intended to be read from the memory array 206. The parity bits 212 are bits added to the data block following the data bits 208, which can be used to determine whether an error has occurred during a read or write operation on the memory array 206. In the illustrated example, the memory device 202 is configured to read and write both the data bits 208 and the parity bits 212 during testing of the memory device 202 to aid in determining the usability of the memory device 202.

The memory device 202 also includes a parity generator unit 214, a parity/difference generator unit 216 and an error correction unit 218. The parity generator unit 214 is configured to access the data bits 208 and to generate additional parity bits 220 from the data bits 208. The generated parity bits 220 are similar to parity bits 212 but are generated from the data bits 208 rather than read from the memory array 206.

The parity/difference generator unit 216 accesses the parity bits 212 in the memory array 206 and receives the generated parity bits 220 from the parity generator unit 214. The parity/difference generator unit 216 compares the parity bits 212 with the generated parity bits 220 to produce the parity/difference information 204. For example, the parity/ difference generator unit 216 may perform a series of exclusive OR operations on the generated parity bits 220 and the parity bits 212 read from the memory array 206 to produce the parity/difference information 204.

The error correction unit 218 receives the data bits 208, as well as the parity/difference information 204 from the parity/ difference generator unit 216. In some implementations, the error correction unit 218 may also receive the parity bits 212 read from the parity generator unit 216. In general, the error correction unit 218 is able to identify if an error is present in the data bits 208 based on the parity/difference information 204 and/or the parity bits 212 and to generate corrected data bits 222 when a correction signal 224 is enabled.

In the illustrated architecture 200, the memory device 202 also includes a multiplexer 226 for selecting the information to be provided to the test system 210 based on a test mode signal 228. For example, the memory device 202, may be configured to output different types of data for different types of testing. For instance, the memory device 202 may output the data bits 208, the corrected data bits 222, the parity bits 212, the parity/difference information 204 and/or any combination thereof.

In general, the multiplexer 226 receives the corrected data bits 222 from the error correction unit 218 or the data bits 208 from the memory array 206. In some cases, the multiplexer 226 may receive both the corrected data bits 222 and the data bits 208. The multiplexer 226 also receives the parity difference information 204 from the parity/difference generator unit 216, and the parity bits 212 and the data bits 208 from the memory array 206. The multiplexer 226 accepts a test mode signal 228 representative of the type of test being run on the memory device 202 and, in response, provides the information indicated in the test mode signal 228 to the test system 210. For instance, the test mode signal 228 may indicate that the parity/difference information 204 should be provided to the test system 210, for testing in a manner similar to that describe above with respect to FIG. 1. In another instances, the test mode signal 228 may indicate that the corrected data bits 222 should be provided to the test system 210 to determine if an uncorrectable error has occurred.

The test system 210 is configured to determine the usability of the memory device 202 by running a series of test reads and/or writes on the memory array 206 of the memory device 202 and comparing the information output by the multiplexer 226 to one or more stored predetermined values 230. For example, the test system 210 may be configured to compare expected parity/difference information with the parity/difference information 204 output by the memory device 202 and the corrected data bits 222 to expected data to determine usability of the device 202.

The test system 210 includes a compare unit 232 and a classification unit 234. The compare unit 232 is configured to receive the selected information (e.g., the parity/difference information 204, the corrected data bits 222, the data bits 208, the parity bits 212 or a combination thereof) from the memory device 202 and to compare the selected information to the predetermined values 230. The classification unit 234 is configured to bin the memory device 202 as passing or failing based on the results of the compare unit 232. For example, if the parity/difference information 204 matches the predetermined values 220, the memory device 202 is binned as passing. However, if the parity/difference information 204 does not match the predetermined values 230, the memory device 202 fails and may be discarded or disposed of.

In one particular example, the test mode signal 228 may indicate that the memory device 202 is to be tested with error correction enabled and that both the corrected data bits 222 and the parity/difference information 204 should be provided to the test system 210 for analysis. In this particular implementation, the test system 210 may determine if the memory device 202 is operating within a level that the error correction unit 218 is able to correct each error as the error occurs.

For example, if the corrected data bits 222 are provided to the test system 210, the test system 210 may compare the corrected data bits 222 with expected data bits to determine if the memory device 202 is operating correctly with the error correction activated. Similarly, the test system 210 may compare the parity/difference information 204 to expected parity/difference information to determine if the memory device 202 is operating with error correction turned off, since the parity/difference information 204 is generated based on the parity bits 212 and the data bits 208 before correction. Thus, in this example, by exposing the parity/difference information 204 together with the corrected data bits 222, the memory device 202 may be binned based a single test pass eliminating the need to run the second test reducing the overall test time for each memory device 202.

FIGS. 3-10 are flow diagrams illustrating example processes for testing memory devices using parity/difference information. The processes are illustrated as a collection of blocks in a logical flow diagram, which represent a sequence of operations, some or all of which can be implemented in hardware, software or a combination thereof. In the context of software, the blocks represent computer-executable instructions stored on one or more computer-readable media that, which when executed by one or more processors, perform the recited operations. Generally, computer-executable instructions include routines, programs, objects, components, data structures and the like that perform particular functions or implement particular abstract data types.

The order in which the operations are described should not be construed as a limitation. Any number of the described blocks can be combined in any order and/or in parallel to implement the process, or alternative processes, and not all of the blocks need be executed. For discussion purposes, the processes herein are described with reference to the frameworks, architectures and environments described in the examples herein, although the processes may be implemented in a wide variety of other frameworks, architectures or environments.

Figure 3:
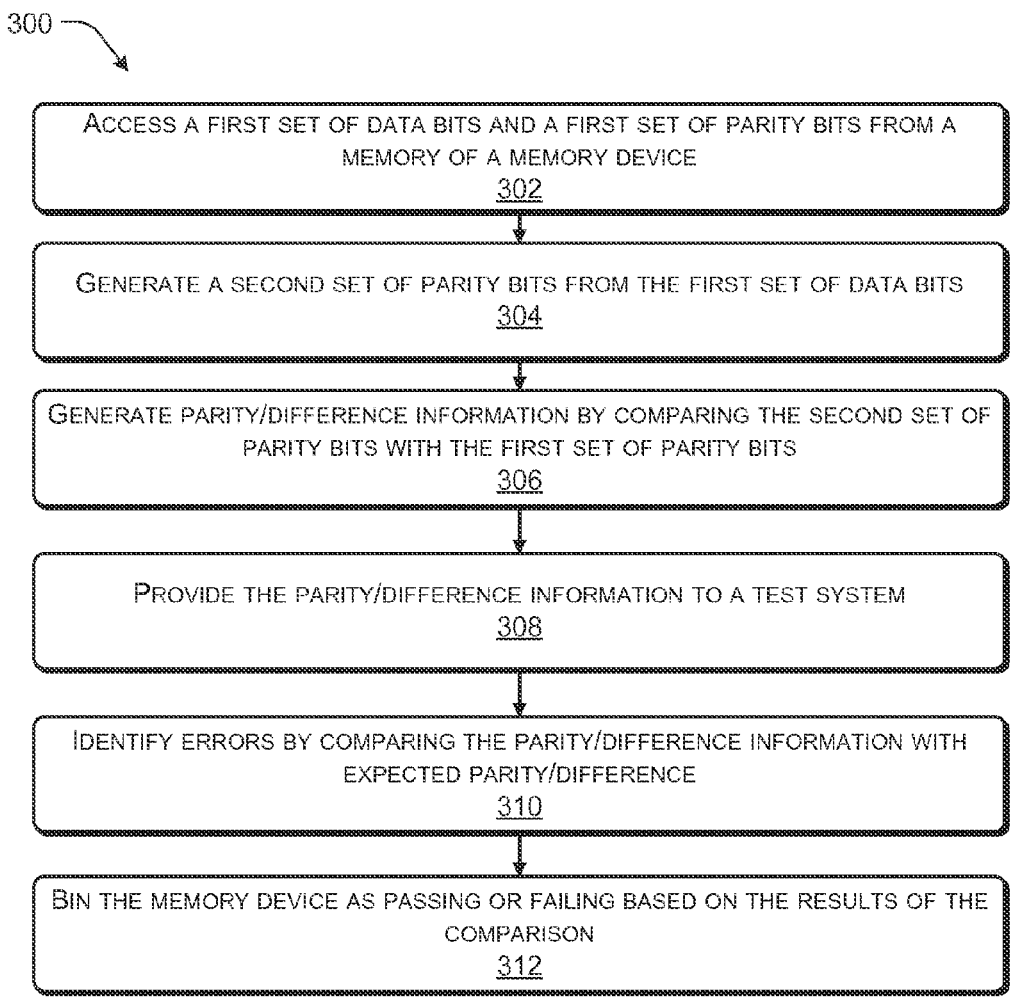
FIG. 3 illustrates an example flow diagram showing an illustrative process for testing memory devices using parity/difference information according to some implementations.

FIG. 3 illustrates an example flow diagram showing an illustrative process 300 for testing memory devices using parity/difference information according to some implementations. At 302, a memory device (e.g., the memory devices 102 and 202 of FIGS. 1 and 2) accesses a first set of data bits and a first set of parity bits from a memory, such as memory arrays 108 and 206. The first set of data bits and the first set of parity bits are may represent bits that are in the memory following the last write operation performed by the memory device.

At 304, the memory device generates a second set of parity bits from the first set of data bits. The second set of parity bits represents the current state of the first set of data bits (e.g., the data bits as read from the memory). For example, an error may have occurred during a previous write operation or read operation, which would cause the data bits to generate parity bits that differ from the parity bits read directly from the memory.

At 306, the memory device generates parity/difference information by comparing the second set of parity bits with the first set of parity bits. For example, there may also be an error in the first set of parity bits or in both the first set of parity bits and the first set of data bits. The error may have occurred during a prior erroneous read or write operation. Regardless, by comparing the first set of parity bits read from the memory and the second set of parity bits generated from the first set of data bits read from memory, the memory device is able to generate the parity/difference information.

At 308, the memory device provides the parity/difference information to a test system. The test system may be an external test system, which may be releasably connected to the memory device for testing, or an internal built-in test system. In each case, the test system is able to identify the number of errors and the location of the errors by comparing the parity/difference information to an expected parity/difference.

At 310, the test system identifies errors by comparing the parity/difference information with expected parity/difference. As described above, the parity/difference information is smaller than the entire data block. Therefore, if the memory device may be tested using the parity/difference information rather than the data bits fewer accesses and comparison may be made by the test system reducing the overall test time.

At 312, the test system bins the memory device as passing or failing based on the results of the comparison. For example, if the expected parity/difference matches the parity/difference information received from the memory device, the device passes the current test (i.e., no errors were detected within the first set of data bits or the first set of parity bits read from the memory). However, if the expected parity/difference diverges from the parity/difference information received from the memory device, the device fails the test (i.e., an error occurred during the test run and the memory device may be discarded as malfunctioning).

Figure 4:
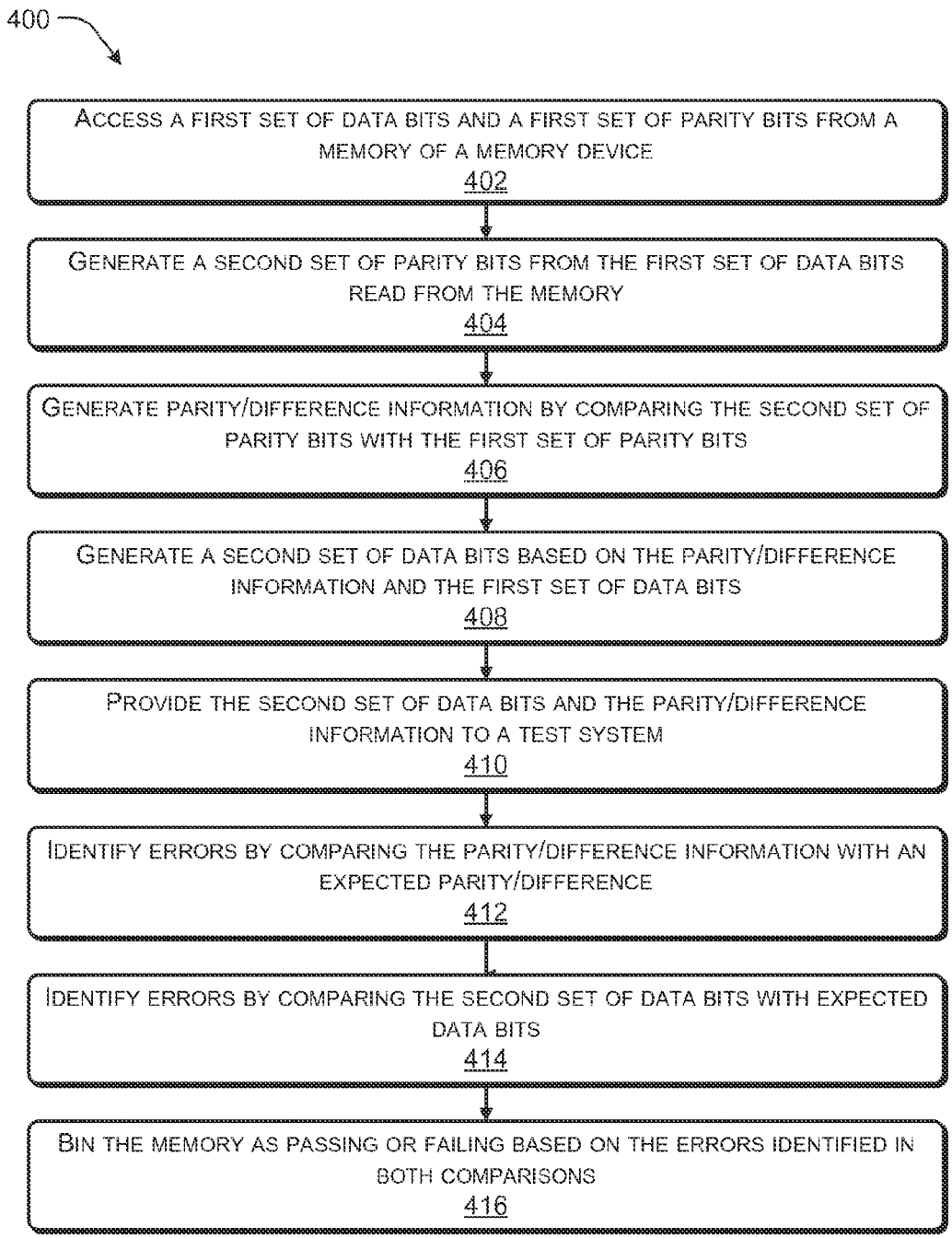
FIG. 4 illustrates another example flow diagram showing an illustrative process for testing memory devices using parity/difference information according to some implementations.

FIG. 3 provides a first example process 300 for utilizing a memory device configured to output parity/difference information to a test system to reduce test time. FIG. 4 provides a second example process 400 for utilizing a memory device configured to output both the parity/difference information and corrected data bits to reduce the overall test time of the memory device.

FIG. 4 illustrates another example flow diagram showing an illustrative process 400 for testing memory devices using parity/difference information according to some implementations. At 402, a memory device accesses a first set of data bits and a first set of parity bits from a memory. The first set of data bits and the first set of parity bits are bits represent bits that are stored in the memory following the last write operation performed by the memory device.

At 404, the memory device generates a second set of parity bits from the first set of data bits. The second set of parity bits represents the current state of the first set of data bits (e.g., the data bits as read from the memory). For example, an error may have occurred during a previous read or write operation, which would cause the data bits to generate parity bits that differ from the first set of parity bits.

At 406, the memory device generates parity/difference information by comparing the second set of parity bits with the first set of parity bits. For example, there may also be an error in the first set of parity bits or in both the first set of parity bits and the first set of data bits. The error may have occurred during a prior erroneous read or write operation. Regardless, by comparing the first set of parity bits read from the memory with the second set of parity bits generated from the first set of data bits read from memory, the memory device is able to generate the parity/difference information.

At 408, the memory device generates a second set of data bits based on the parity/difference information and the first set of data bits. For example, the memory device may be equipped with an error correction unit which is able to identify, isolate and correct (i.e., flip) data bits which are erroneous based on the parity/difference information. The error correction unit may be a single error correction unit or multi-bit error correction unit. Regardless of the type of error correction, the second set of data bits represent a set of data bits that are at least partially corrected by the error correction unit of the memory device and are more representative of the data output by the memory device during regular operation.

In some examples, the second set of data bits may be a different subset of the address space than the first set of data bits (i.e., the number of bits in each set may vary and/or the sets may include different bits). For example, the first set of data bits may be read from the memory, the parity/difference information generated, the error correction performed on the entire address space and then the second set of data bits are read from the address space.

At 410, the memory device provides the second set of data bits and the parity/difference information to a test system. The test system may be an external test system, which may be releasably connected to the memory device for testing, or an internal test system. In each case, the test system is able to determine the usability of the memory device from the second set of data bits and the parity/difference information.

At 412, the test system identifies errors by comparing the parity/difference information with an expected parity/difference. The errors identified by use of the parity/difference information represent errors which occurred with error correction turned off (i.e., errors present within at least one of the first set of data bits and the first set of parity bits), which if consistently present (i.e., same bits having the same errors) over multiple test runs may cause the device to fail but the presence of which in a single test do not cause the device to be binned or classified as failing.

At 414, the test system identifies errors by comparing the second set of data bits with expected data bits. The errors identified by use of the second set of data bits represent errors, which occurred with error correction turned on. Errors detected using the second set of data bits are uncorrectable (i.e., errors which the error correction unit was unable to identify and correct) and causes the device to be binned as failing.

At 416, the test system bins the memory device as passing or failing based on the results of both comparisons. For example, if the second set of data bits matches the expected data and the expected parity/difference matches the parity/difference information received from the memory device, the device passes the current test. If the second set of data bits matches the expected data and the expected parity/difference diverges from the parity/difference information received from the memory device, the device does not need to be discarded outright. If the second set of data bits differs from the expected data bits, the device fails regardless of the results of the parity/difference testing as an uncorrectable error has occurred and the device may be discarded.

As described above, since the test system is able to ascertain the presence of errors both with and without error correction turned on, only one test may be required for each test pattern. In this manner, the number of test runs, which are performed on each memory device may be reduced significantly reducing overall test time.

Figure 5:
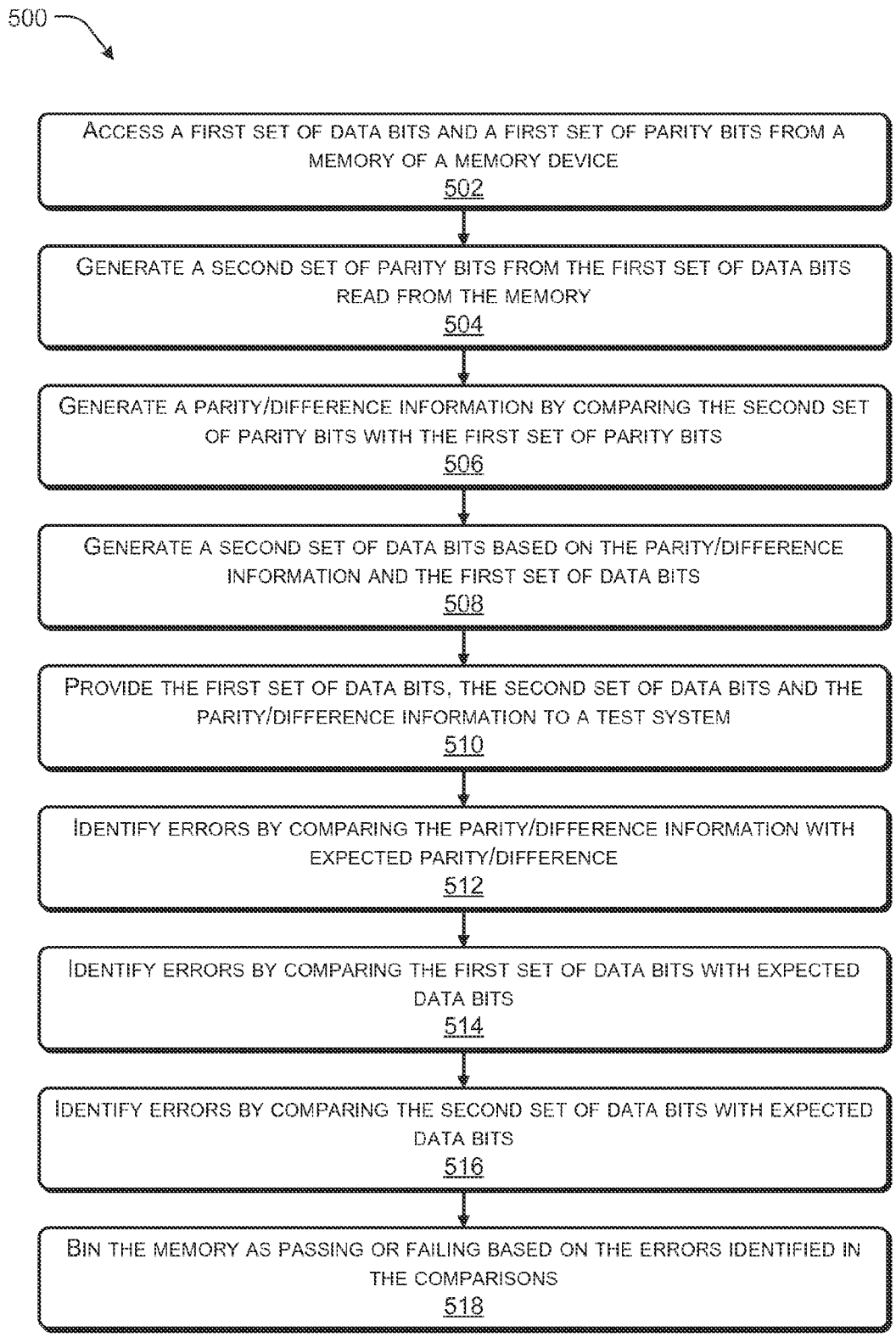
FIG. 5 illustrates another example flow diagram showing an illustrative process for testing memory devices using parity/difference information according to some implementations.

FIG. 5 illustrates another example flow diagram showing an illustrative process 500 for testing memory devices using parity/difference information according to some implementations. At 502, a memory device accesses a first set of data bits and a first set of parity bits from a memory. The first set of data bits and the first set of parity bits are those stored in the memory following the last write operation performed by the memory device.

At 504, the memory device generates a second set of parity bits from the first set of data bits. The second set of parity bits represents the current state of the first set of data bits (e.g., the data bits as read from the memory). For example, an error may have occurred during a previous write operation or during a read operation, which would cause the data bits to generate parity bits that differ from the parity bits read directly from the memory.

At 506, the memory device generates parity/difference information by comparing the second set of parity bits with the first set of parity bits. For example, there may also be an error in the first set of parity bits or in both the first set of parity bits and the first set of data bits. The error may have occurred during a prior erroneous read or write operation.

At 508, the memory device generates a second set of data bits based on the parity/difference information and the first set of data bits. For example, the memory device may be equipped with an error correction unit, which is able to identify, isolate and correct (i.e., flip) data bits which are erroneous based on the parity/difference information. The error correction unit may be a single error correction unit or multi-bit error correction unit. Regardless of the type of error correction, the second set of data bits represent a set of data bits that are at least partially corrected by the error correction unit and are more representative of the data output by the memory device during regular operation, as the error correction unit is typically turned on during normal operations.

In some examples, the second set of data bits may be a different subset of the address space than the first set of data bits (i.e., the number of bits in each set may vary and/or the sets may includes different bits). For example, the first set of data bits may be read from the memory, the parity/difference information generated, the error correction performed on the entire address space and then the second set of data bits are read from a portion of the address space.

At 510, the memory device provides the first set of data bits, the second set of data bits and the parity/difference information to a test system. The test system may be an external test system, which may be releasably connected to the memory device for testing, or an internal built-in test system. In each case, the test system is able to determine the usability of the memory device from the second set of data bits and the parity/difference information. In one particular implementation, the set of data bits used to generate the second set of parity bits may vary from the set first set of data bits provided to the test system. For example, the data bits used to generate the second set of parity bits may be an entire data block, while the first set of data bits provided to the test system may be a subset of the memory block.

At 512, the test system identifies errors by comparing the parity/difference information with expected parity/difference. The errors identified by use of the parity/difference information represent errors, which occurred with error correction turned off (i.e., errors present within at least one of the first set of data bits and/or the first set of parity bits), which if consistently present (i.e., same bits having the same errors) over multiple test runs may cause the device to fail but the presence of which in a single test run are not disconcerting and in some cases expected.

At 514, the test system identifies errors by comparing the first set of data bits with expected data bits. The errors identified by use of the first set of data bits represent errors similar to those detected by comparing the parity/difference information (i.e., errors that occurred with error correction turned off).

At 516, the test system identifies errors by comparing the second set of data bits with the expected data bits. The errors identified by use of the second set of data bits represent errors which occurred with error correction turned on (i.e., errors which the error correction unit was unable to identify and correct) and when present causes the device to be binned as failing. In some implementations, the expected data bits may be the same, such as when the first set of data bits and the second set of data bits are identical subsets of the address space. However, in some alternative implementations, the expected data bits for the first set of data bits and the expected data bits for the second set of data bits may vary, such as when both sets of data bits are different subsets of the address space.

At 518, the test system bins the memory device as passing or failing based on the results of the comparisons. For example, the test system can determine if any uncorrectable errors occurred based on the comparison of the second set of data bits with the expedited data bits. The test system can also determine if any correctable errors occurred based on the comparison of the parity/difference information with the expected parity/difference. Finally, the test system can determine the number of correctable errors which occurred by comparing the first set of data bits to the expected data bits. In this way, the test system may bin the memory device based on the occurrence of uncorrectable errors and the number of correctable errors. For instance, a device may be considered unusable if any uncorrectable errors are detected or if more than a threshold number of correctable errors are detected.

Figure 6:
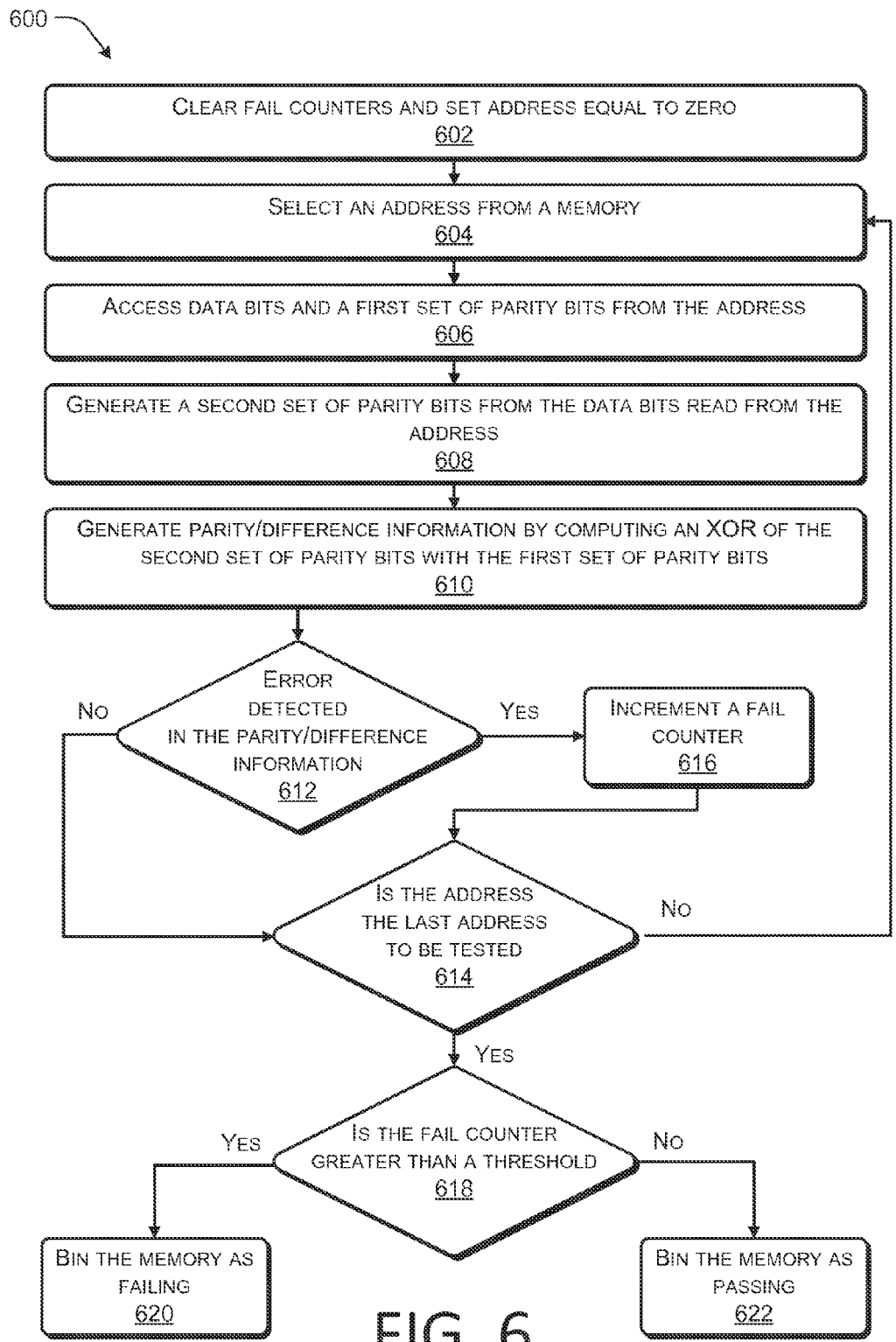
FIG. 6 illustrates another example flow diagram showing an illustrative process for testing memory devices using parity/difference information according to some implementations.

FIG. 6 illustrates another example flow diagram showing an illustrative process 600 for testing memory devices using parity/difference information according to some implementations. At 602, a memory device (e.g., the memory devices 102 and 202 of FIGS. 1 and 2) or a test system (e.g., the test system 106 or 212 of FIGS. 1 and 2) initializes the system for testing by clearing the fail counters and setting the address equal to zero.

At 604, the memory device selects an address from the memory and, at 606, the memory device accesses data bits and a first set of parity bits from the selected address. In some particular implementations, the memory device may select multiple addresses and access the data bits and parity bits from each of the addresses.

At 608, the memory device generates a second set of parity bits from the data bits read from the address. The second set of parity bits represents the current state of the data bits as read from the memory array. For example, an error may have occurred during a previous read or write operation, which would cause the data bits to generate parity bits that differ from the first set of parity bits read directly from the memory.

At 610, the memory device generates parity/difference information by computing an XOR of the second set of parity bits with the first set of parity bits. For example, there may also be an error in the first set of parity bits or in both the first set of parity bits and the first set of data bits. The error may have occurred during a prior erroneous read or write operation. By XORing the first set of parity bits read from the memory with the second set of parity bits generated from the first set of data bits, the memory device is able to generate parity/difference information, which may be used to identify errors.

At 612, the memory device determines if an error is detected in the parity/difference information. For example, in one implementation, if the parity/difference information (e.g., the results of the XOR computed using the first set of data bits and the second set of data bits) is equal to zero or any other predetermined value, no errors have occurred and the process 600 proceeds to 614. Otherwise, an error has occurred and the process 600 proceeds to 616, where the memory device increments a fail counter.

At 614, the memory device determines if the selected address is the last address to be tested. For example, the memory device may be tested with a series of address accesses and the usability of the memory device may be evaluated based on the number of errors detected over the series of accesses. If the address is not the last address to be tested, the process 600 returns to 604 and another address is selected from the memory. However, if the address is the last address to be tested, the process 600 advances to 618 and the usability of the memory device is determined.

In the example illustrated in FIG. 6, the memory device determines the usability based on whether the fail counter is greater than a threshold number of errors, at 618. If the fail counter is greater than the threshold, the process 600 proceeds to 620 and the memory device is binned as failing. Otherwise, the process 600 proceeds to 622 and the memory device is binned as passing. For example, as described above in some memory devices, such as magnetic memory devices, some number of errors are expected and can be corrected during operation. Therefore, in some types of memory devices the detection of a single error or even a few errors does not render the device unusable. Thus, a threshold number of errors may be determined based on the type of memory device and the memory device is binned as failing when more than the threshold number of errors are detected.

Figure 7:
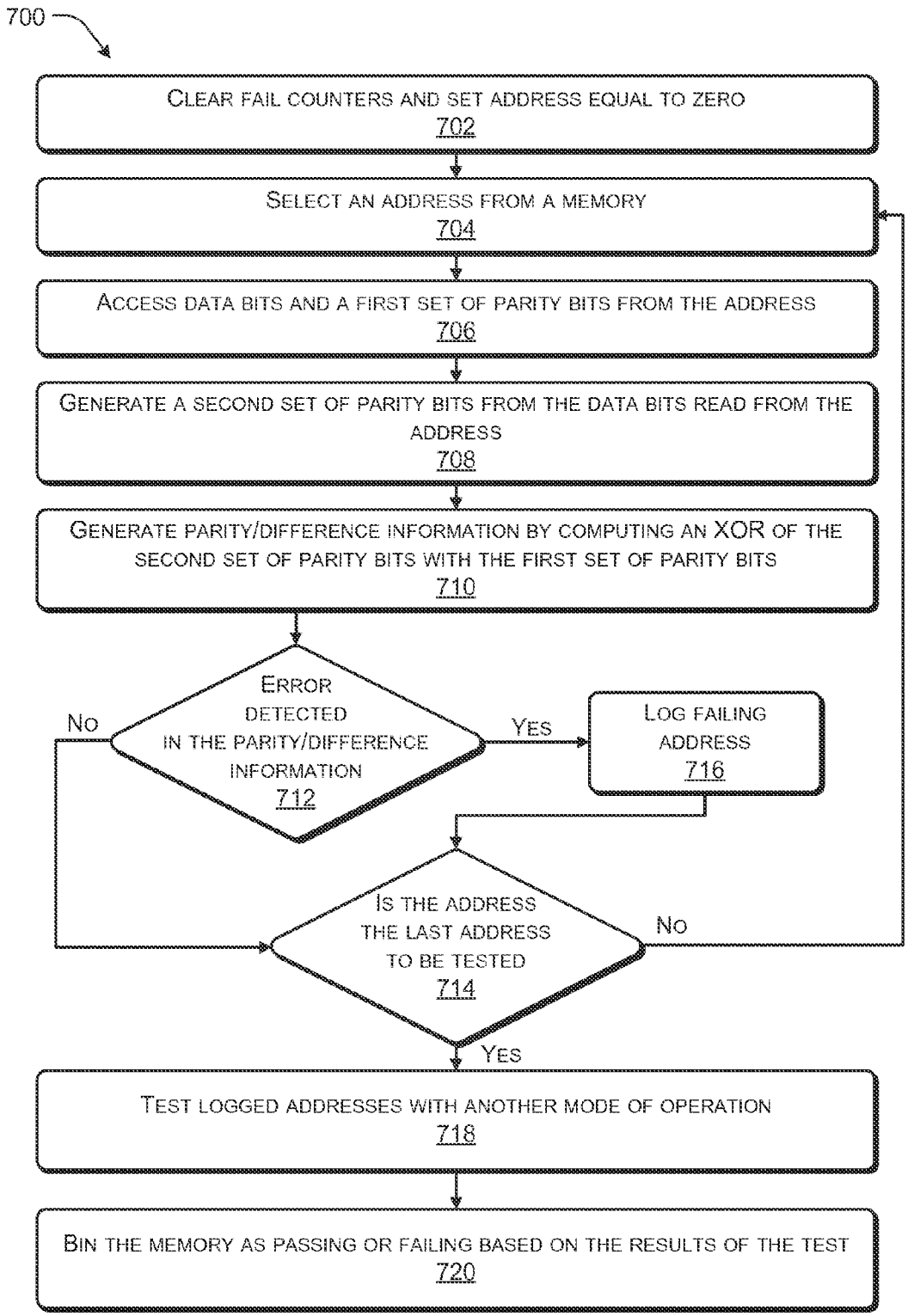
FIG. 7 illustrates another example flow diagram showing an illustrative process for testing memory devices using parity/difference information according to some implementations.

Thus, FIG. 6 provides one example process for binning a memory device as passing or failing using the parity/difference information and a fail counter. FIG. 7 provides another example process for binning a memory device as passing or failing using parity/difference information and an address log.

FIG. 7 illustrates another example flow diagram showing an illustrative process 700 for testing memory devices using parity/difference information according to some implementations. At 702, a memory device or a test system initializes the system for testing by clearing one or more fail counters and setting the address equal to zero.

At 704, the memory device selects an address from the memory and, at 706, the memory device accesses data bits and a first set of parity bits from the selected address. In some particular implementations, the memory device may select an address that has already been tested, for example, to test the memory address using different test data or test patterns.

At 708, the memory device generates a second set of parity bits from the data bits read from the address. The second set of parity bits represents the current state of the data bits as read from the memory array. For example, an error may have occurred during a previous write operation or even during the most recent read operation, which would cause the data bits to generate parity bits that differ from the first set of parity bits read directly from the memory.

At 710, the memory device generates parity/difference information by computing an XOR of the second set of parity bits with the first set of parity bits. By XORing the first set of parity bits and the second set of parity bits generated from the data bits, the memory device is able to generate parity/difference information, which may be used to identify errors.

At 712, the memory device determines if an error is detected in the parity/difference information. For example, in one implementation, if the parity/difference information (e.g., the results of the XOR computed on the first set of data bits and the second set of data bits) is equal to an expected parity/difference, no errors have occurred, and the process 700 proceeds to 714. Otherwise, an error has occurred and the process 700 proceeds to 716. At 716, the memory device logs the failing address for use in analyzing the usability of the memory device following the completion of the test and proceeds to 714.

At 714, the memory device determines if the selected address is the last address to be tested. For example, the memory device may be tested with a series of accesses and the usability of the memory device may be evaluated based on the number of addresses logged or the number of times each address was logged during the test. If the address is not the last address to be tested, the process 700 returns to 704, where another address is selected, and another test is run. If, however, the address is the last address to be tested, the process 700 advances to 718.

At 718, the memory device or the test system tests the logged addresses with another mode of operation. For example, the memory device may re-test the address with error correction turned on to determine if the error was a correctable error or an uncorrectable error.

At 720, the memory device is binned as either passing or failing based on the results of the test. For example, if one or more uncorrectable errors are detected, the memory device may be binned as failing. In another example, the memory device may be binned as failing if more than a threshold number of addresses are logged (i.e., if more than a threshold number of correctable errors occurred).

Figure 8:
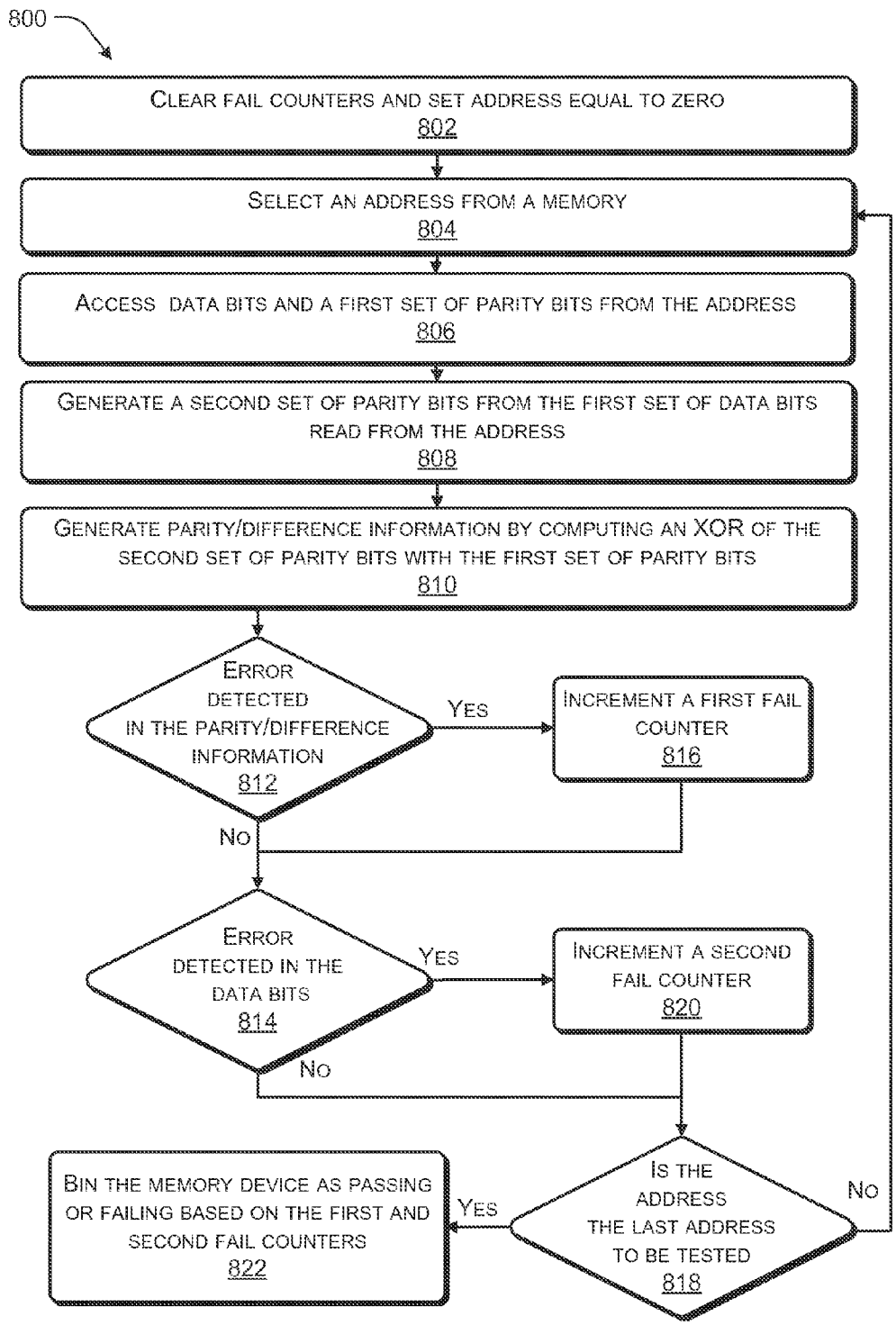
FIG. 8 illustrates another example flow diagram showing an illustrative process for testing memory devices using parity/difference information according to some implementations.

FIG. 7 provides an example process for binning a memory device as passing or failing using the parity/difference information and an address log. FIG. 8 provides another example process for binning a memory device as passing or failing using parity/difference information and multiple fail counters.

FIG. 8 illustrates another example flow diagram showing an illustrative process 800 for testing memory devices using parity/difference information according to some implementations. At 802, a memory device or a test system initializes the system for testing by clearing the multiple fail counters and setting the address equal to zero.

At 804, the memory device selects an address from the memory and, at 806, the memory device accesses data bits and a first set of parity bits from the selected address. In some particular implementations, the memory device may select multiple addresses and access the data bits and parity bits from each of the addresses.

At 808, the memory device generates a second set of parity bits from the data bits read from the address. The second set of parity bits represents the current state of the data bits as read from the memory array. For example, an error may have occurred during a previous read or write operation, which would cause the data bits to generate parity bits that differ from the first set of parity bits.

At 810, the memory device generates parity/difference information by computing an XOR of the second set of parity bits with the first set of parity bits. For example, by performing a series of exclusive XOR operations on the first set of parity bits and the second set of parity bits generated from the first set of data bits read, the memory device is able to generate the parity/difference information.

At 812, the memory device determines if an error is detected in the parity/difference information. For example, in one implementation, if the parity/difference information (e.g., the results of the XOR computed on the first set of data bits and the second set of data bits) is equal to an expected parity/difference, no errors have occurred and the process 800 proceeds to 814. Otherwise, an error has occurred and the process 800 proceeds to 816, where the memory device increments a first fail counter and proceeds to 814.

At 814, the memory device determines if an error is detected in the data bits themselves. For example, in one implementation, it may be beneficial to identify errors in both the parity/difference information and in the uncorrected data bits in order to bin the device as passing or failing. Thus, the memory device may also compare the data bits to expected data to detect errors. If the data bits match the expected data, no data bit errors have occurred and the process 800 proceeds to 818. Otherwise, an error has occurred and the process 800 proceeds to 820.

At 820, the memory device increments a second fail counter. For example, the first fail counter may count the number of errors detected in the parity/difference information, while the second fail counter may count the number of errors detected in the data bits as read from the address. The memory device may then be binned based on the first fail counter (i.e., the number of errors detected in parity/difference information), the second fail counter (i.e., the number of errors detected in the data bits themselves) or a combination thereof.

At 818, the memory device determines if the address selected is the last address to be tested. For example, the memory device may be tested with a series of address accesses and the usability of the memory device may be evaluated based on the number of errors detected over the series of accesses. If the address is not the last address to be tested the process 800 returns to 804 and another address is selected from the memory. If, however, the address is the last address to be tested the process 800 advances to 822 and the usability of the memory device is determined.

At 822, the memory device bins the memory device as passing (usable) or failing (unusable) based on the first and second fail counters. For instance, in one implementation, if the total number of fails detected by both the first and second fail counters are greater than a threshold number, the memory device is binned as failing. In another example, if the first fail counter is greater than a first threshold and the second fail counter is greater than a second threshold, the device may be binned as failing. In yet another example, if the first fail counter is greater than the first threshold or the second fail counter is greater than the second threshold, the device may be binned as failing. Therefore, the device may be binned as failing based on a combination of the first and second fail counters or individually based on either the first fail counter or the second fail counter.

Figure 9:
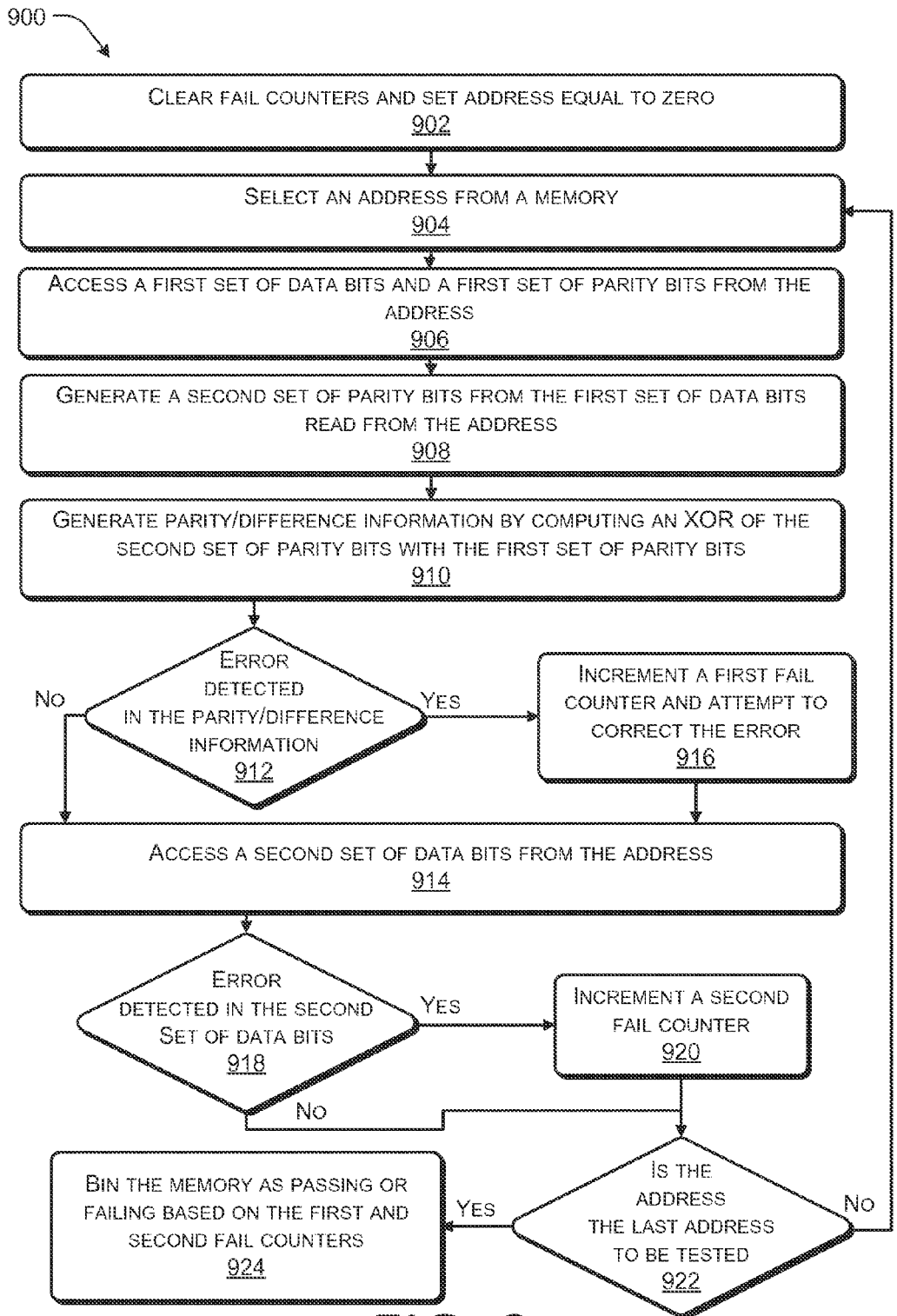
FIG. 9 illustrates another example flow diagram showing an illustrative process for testing memory devices using parity/difference information according to some implementations.

FIG. 8 provides one example process for binning a memory device as passing or failing using the parity/difference information and multiple fail counters. FIG. 9 provides a second example process for binning a memory device as passing or failing using parity/difference information and multiple fail counters.

FIG. 9 illustrates another example flow diagram showing an illustrative process for testing memory devices using parity/difference information according to some implementations. At 902, a memory device or a test system initializes the system for testing by clearing the fail counters and setting the address equal to zero.

At 904, the memory device selects an address from the memory, the memory device accesses a first set of data bits and a first set of parity bits from the selected address. In some particular implementations, the memory device may iterate through the memory array testing each address in sequence until each of the addresses has been tested at least once.

At 908, the memory device generates a second set of parity bits from the first set of data bits read from the address. The second set of parity bits represents the current state of the data bits. For example, an error may have occurred during a previous read or write operation, which would cause the first set of data bits to generate parity bits that differ from the first set of parity bits read directly from the memory.

At 910, the memory device generates parity/difference information by computing an XOR of the second set of parity bits with the first set of parity bits. For example, the memory device may perform a series of XOR operations on the first set of parity bits and the second set of parity bits generated from the first set of data bits to generate the parity/difference information.

At 912, the memory device determines if an error is detected in the parity/difference information. For example, in one implementation, if the parity/difference information (i.e., the results of the XOR computed on the first set of data bits and the second set of data bits) is equal to an expected parity/difference, no errors have occurred and the process 900 proceeds to 914. Otherwise, an error has occurred and the process 900 proceeds to 916.

At 916, the memory device increments a first fail counter and attempts to correct the error. For example, the memory device may include a built-in error correction module, which is able to correct one or more identified errors. In some implementations, the error correction module may be configured to utilize the parity/difference information to identify and correct erroneous bits.

At 914, the memory device accesses a second set of data bits from the selected address after the error correction module has attempted to correct the errors identified at 916. The second set of data bits should contain no errors if the memory device is operating correctly. The second set of data bits may be the same as or differ from the first set of data bits.

At 918, the memory device determines if an error is detected in the second set of data bits. For example, the memory device may compare the second set of data bits with expected data to identify the number and location of errors in the second set of data bits. If the second set of data bits matches the expected data, no errors have occurred and the process 900. Otherwise, an error has occurred and the process 900 proceeds to 920. In this manner, the amount of time necessary to test the memory device may be reduced as the errors identified with the parity/difference information correlate to correctable errors (i.e., errors which the error correction unit can compensate for) and the errors identified with the second set of data bits correlate to uncorrectable errors (i.e., errors that the error correction unit is unable to compensate for).

At 920, the memory device increments a second fail counter. For example, the first fail counter may count the number of correctable errors identified using the parity/difference information reflecting correctable errors and the second fail counter may count the number of uncorrectable errors identified using the second set of data bits.

At 922, the memory device determines if the address selected is the last address to be tested. For example, the memory device may be tested with a series of address accesses and the usability of the memory device may be evaluated based on the number of errors detected during the entire test. If the address is not the last address to be tested, the process 900 returns to 904 and another address is selected from the memory. If, however, the address is the last address to be tested the process 900 advances to 924 and the usability of the memory device is determined.

At 924, the memory device bins the memory device as passing (usable) or failing (unusable) based on the first and second fail counters. For instance, in one implementation, the first fail counter tracks the number of correctable errors and some number of correctable errors may be considered acceptable in the memory device. Therefore, if the total number of fails detected by the first fail counter is below a threshold, the device may be usable and binned as passing. On the other hand, if the first fail counter is greater than the threshold, the device may be classified as unusable and binned as failing. In another example, the second fail counter tracks the number of uncorrectable errors that have occurred. In this implementation, the memory device may be binned as failing upon the occurrence of a single error. In other implementations, the device may be binned as passing or failing based on the total number of errors identified using the first and second fail counters. In yet another implementation, the memory device may be binned as passing or failing based on a comparison of the first fail counter to a first threshold and the second fail counter to a second threshold. In some specific implementations, a first weight may be applied to the first fail counter and a second weight applied to the second fail counter and the device binned based on the first and second weights.

Figure 10:
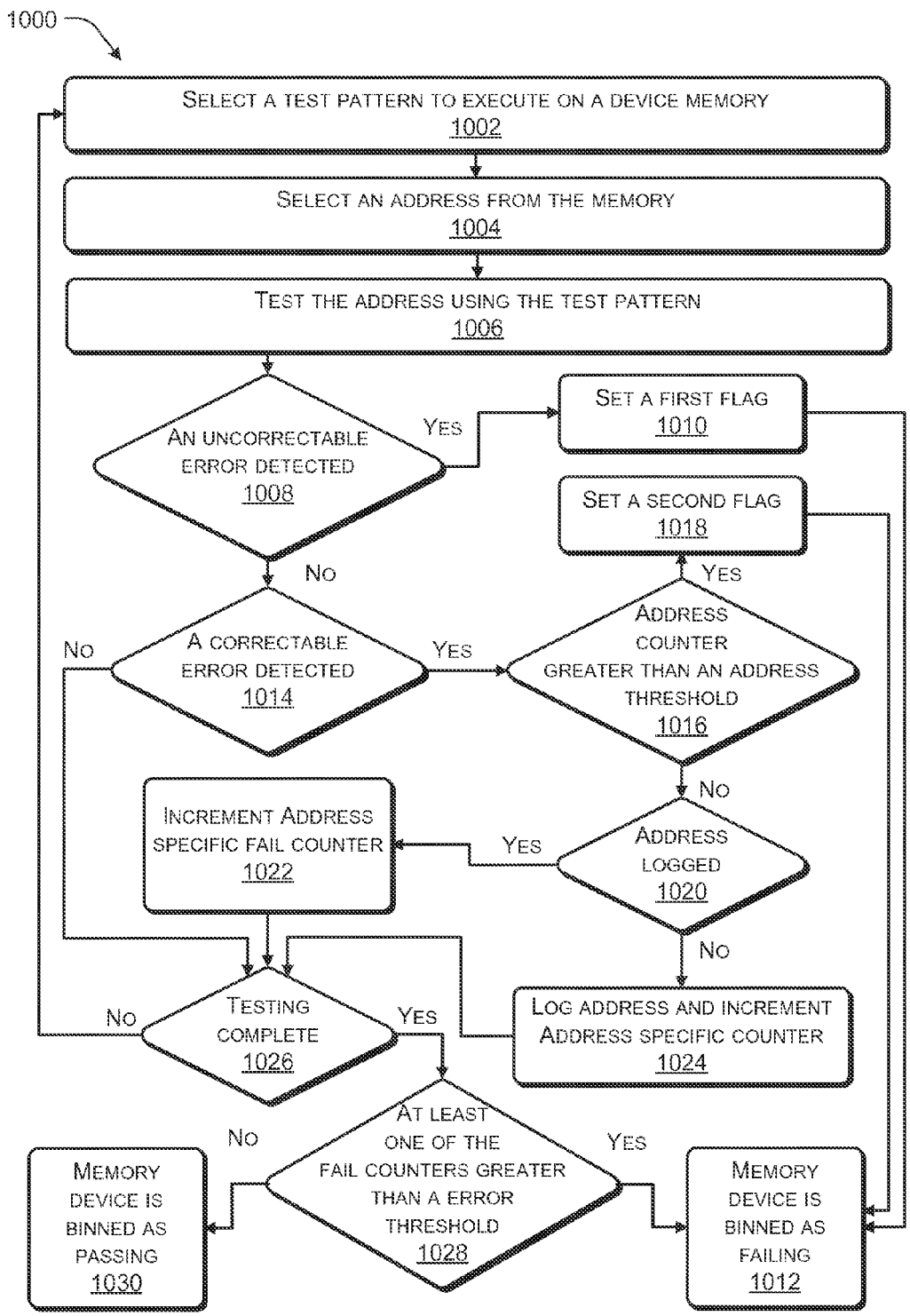
FIG. 10 illustrates another example flow diagram showing an illustrative process for testing memory devices using parity/difference information according to some implementations.

FIGS. 6-9 provide example processes for binning a memory device as passing or failing using at least the parity/difference information. FIG. 10 provides an example process for testing a memory device as passing or failing using parity/difference information, multiple flags and multiple counters.

FIG. 10 illustrates another example flow diagram showing an illustrative process 1000 for testing memory devices using parity/difference information according to some implementations. At 1002, a test system (e.g., the test system 106 or 212 of FIGS. 1 and 2) selects a test pattern to execute on a memory device. The test pattern may be a series of reads and/or writes from the memory device that results in a unique data pattern that may be read from the memory device and compared to expected data to determine usability of the device.

At 1004, the test system selects an address from the memory device to test and, at 1006, the test system tests the address using the test pattern by reading and writing data to the address space. The address may be selected at random from the memory device, or each address may be selected in sequence. For instance, in some memory devices a randomized testing of a portion of the memory addresses may be sufficient to determine usability, while in other device types, it may be important to test the entire memory. In some examples, the selection and testing of the memory addresses may be non-sequential but the test may ensure that every address is tested at least with a single test pattern.

At 1008, the test system determines if any uncorrectable errors are detected. For example, the test system may receive the data read from the memory device at the selected address as if the device was in regular operation. In this example, the test system receives the data after the data has passed through the error correction module of the memory device and, therefore, any errors detected in the data may be considered uncorrectable. To indentify the uncorrectable errors, the test system may compare the data read form the memory device at the selected address to the expected results or the expected data pattern.

If an uncorrectable error is detected at 1008, the process 1000 advances to 1010, where the test system sets a first flag indicating the presence of an uncorrectable error. If the first flag is set, the memory device has failed and the process 1000 proceeds to 1012. At 1012, the test system bins the memory device as failing.

If, however, no uncorrectable errors are detected by the test system at 1008, the process 1000 advances to 1014. At 1014, the test system determines if any correctable errors have occurred. For example, the memory device may output the parity/difference information that was generated based on the data bits and the parity bits read from memory, as described above. Since the parity/difference information reflects the state of the memory before error correction is applied, the parity/difference information may be used to detect correctable errors. For instance, the test system may compare the parity/difference information to an expected parity/difference and if the information matches, no correctable errors occurred. Otherwise, at least one correctable error did occur.

If a correctable error did occur, the process 1000 proceeds to 1016. At 1016, the test system checks the address counter to determine if the address counter is greater than an address threshold. For example, as discussed above, in some types of memory devices some number of random errors is to be expected and the occurrence of these errors does not necessarily cause the device to fail. However, the more addresses having errors, the more likely the device is corrupted. Therefore, in the illustrated implementation, the test system increments an address counter and compares the address counter with an address threshold to determine if the error is a random error or a problem with the device itself.

If the address counter is greater than the address threshold, the process 1000 advances to 1018. At 1018, the test system sets a second flag indicating that too many addresses have errors and the device has failed. Therefore, if the second flag is set, the process 1000 proceeds to 1012, where the test system bins the memory device as failing.

If, however, the address counter is less than the address threshold at 1016, the process 1000 proceeds to 1020. At 1020, the test system checks the address log to determine if the address has previously been identified as having errors and if the address is logged, the process 1000 advances to 1022. At 1022, the test system increments an address specific fail counter for the selected address. Each address that fails on one or more of the test patterns has a fail counter. Each of the fail counters represent the number of test patterns that corresponding address failed at. If the address is not logged in the address log, the process 1000 proceeds to 1024. At 1024, the test system logs the selected address and increments the address specific fail counter.

At 1026, the test system determines if the testing is complete. For example, the testing may be complete when a test pattern has been applied to each address of the memory device or when the test system has run every test pattern on the device. In some examples, the testing is complete when the test system has run each test pattern on each memory address. If the testing is not complete, the process 1000 returns to 1002 and another test pattern is selected.

If, however, the testing is complete, the process 1000 advances to 1028 and the test system compares each of the address specific fail counters with an associated error threshold. For example, as discussed above, in some types of memory devices some number of random errors is to be expected and the occurrence of these errors does not necessarily mean the device is unusable. However, the more errors that appear in the same address space of the memory device, the more likely the device is corrupted. Therefore, in the illustrated implementation, the test system compares an address specific fail counter to an error threshold for each address that experienced an error during the test. If at least one of the address specific fail counters are greater than the error threshold, the process 1000 proceeds to 1012 and the device is binned as failing. Otherwise, the process 1000 proceeds to 1030 and the device is binned as passing.

Although the subject matter has been described in language specific to structural features, it is to be understood that the subject matter defined in the appended claims is not necessarily limited to the specific features described. Rather, the specific features are disclosed as illustrative forms of implementing the claims.

What is claimed is:

1. A method comprising:
causing, by a test system releasably coupled to a memory device, the memory device to perform, on a memory space corresponding to an address:
   a series of read operations and write operations;
   a first operation to read a first set of data bits and a first set of parity bits from the memory space corresponding to the address;
   a second operation to generate a second set of parity bits from the first set of data bits;
   a third operation to generate a multi-dimensional array representative of a location and a number of errors in the first set of data bits and the first set of parity bits;
   a fourth operation to generate a second set of data bits based at least in part on the first set of data bits and the multi-dimensional array;
receiving, at the test system from the memory device, the multi-dimensional array and the second set of data bits;
performing, by the test system, a first comparison of the multi-dimensional array to an expected result to identify the location and the number of errors within the first set of data bits and the first set of parity bits, the location and the number of errors within the first set of data bits and the first set of parity bits representative of errors that occurred with an error correction unit of the memory device disabled;
performing, by the test system, a second comparison including comparing the second set of data bits to expected data to identify a location and a number of errors within the second set of data bits, the location and the number of errors within the second set of data bits representative of errors that occurred with the error correction unit of the memory device enabled; and
binning, by the test system, the memory device as usable or unusable based at least in part on the number of errors within the first set of data bits and the first set of parity bits and the number of errors within the second set of data bits.

2. The method as recited in claim 1,
wherein the second set of data bits represent a memory device corrected version of the first set of data bits expected data; and
binning the memory device as usable or unusable based at least in part on the first.

3. The method as recited in claim 2, wherein the memory device is binned as unusable when the second set of data bits does not match the expected data.

4. The method as recited in claim 1, further comprising:
logging the address in an address log and incrementing a fail counter when the parity/difference information does not match the expected result;
testing the memory device by causing the memory device to perform a series of read and write operations on a second memory space corresponding to a second address;
reading a second set of data bits and a third set of parity bits from the second memory space corresponding to the second address;
generating a fourth set of parity bits from the second set of data bits;
generating additional multi-dimensional array based on the third set of parity bits and the fourth set of parity bits;
performing a second comparison including comparing the additional multi-dimensional array generated from the third set of parity bits and the fourth set of parity bits to the expected result;
logging the second address in the address log and incrementing the fail counter when the additional multi-dimensional array generated from the third set of parity bits and the fourth set of parity bits does not match the expected result; and
wherein the binning the memory device as usable or unusable is also based on the address log and the fail counter.

5. The method as recited in claim 1, wherein the multi-dimensional array is received via a single memory access.

6. A memory device comprising:
one or more memory arrays, the one or more memory arrays storing a first set of data bits and a first set of parity bits associated with the first set of data bits;
a parity generator unit to generate a second set of parity bits from the first set of data bits;
a parity/difference generator unit to generate a two-dimensional array based on the first set of parity bits being XORed with the second set of parity bits, the two-dimensional array of information related to a location and a number of errors in the first set of data bits and the first set of parity bits;
an error correction unit to generate a second set of data bits based at least in part on the first set of data bits and the two-dimensional array;
an output interface to output the two-dimensional array and the second set of data bits;
a test system to receive the two-dimensional array and the second set of data bits and perform:
   a first comparison of the two-dimensional array to an expected result to identify the location and the number of errors within the first set of data bits and the first set of parity bits, the location and the number of errors within the first set of data bits and the first set of parity bits representative of errors that occurred with an error correction unit of the memory device disabled;
   a second comparison including comparing the second set of data bits to expected data to identify a location and a number of errors within the second set of data bits, the location and the number of errors within the second set of data bits representative of errors that occurred with the error correction unit of the memory device enabled; and
   binning of the memory device as usable or unusable based at least in part on the number of errors within the first set of data bits and the first set of parity bits and the number of errors within the second set of data bits.

7. The memory device as recited in claim 6, wherein the second set of data bits represent a corrected version of the first set of data bits.

8. The memory device as recited in claim 6, wherein the error correction unit performs single bit error correction.

9. The memory device as recited in claim 6, wherein the error correction unit performs multiple bit error correction.

10. The memory device as recited in claim 6, wherein the output interface further sends the first set of parity bits to the test system.

11. The memory device as recited in claim 6, wherein the output interface releasably couples to the test.

12. The memory device as recited in claim 6, wherein the test system is an external test system.

13. The memory device as recited in claim 6, wherein the test system is a built-in test system.

14. The memory device as recited in claim 13, wherein the built-in test system bins the memory device as passing or failing based at least in part on a comparison of the two-dimensional array with an expected result parity/difference.

15. One or more non-transitory computer-readable media having computer-executable instructions that, when executed by one or more processors, cause the one or more processors to perform operations comprising:
  selecting a test pattern to test a memory device;
  selecting an address of the memory device to test;
  causing the memory device to perform a series of read and write operations on a memory space corresponding to the address;
  receiving, from the memory device, a multi-dimensional array, the multi-dimensional array related to a location and a number of errors in a first set of data bits and parity bits;
  receiving, from the memory device, a second set of data bits, the second set of data bits based at least in part on the first set of data bits and the multi-dimensional array;
  comparing the multi-dimensional array to an expected result to identify the number of errors in the first set of data bits and the parity bits, the location and the number of errors within the first set of data bits and the parity bits representative of errors that occurred with an error correction unit of the memory device disabled;
  comparing the second set of data bits to expected data to identify the number of errors in the second set of data bits, a location and a number of errors within the second set of data bits representative of errors that occurred with the error correction unit of the memory device enabled; and
  binning the memory device as usable or unusable based at least in part on the number of errors in the first set of data bits and the parity bits and the number of errors in the second set of data bits.

16. The one or more non-transitory computer-readable media as recited in claim 15, further comprising:
  providing a correction enable signal to the memory device prior to receiving the second set of data bits, the correction enable signal to cause the memory device to implement error correction on data read from the memory space corresponding to the address receiving corrected data from the memory device;
  comparing the corrected data to expected data; and
  wherein the memory device is binned as usable or unusable based in part on the comparison of the corrected data to the expected data.

17. The one or more non-transitory computer-readable media as recited in claim 15, wherein the multi-dimensional array is generated by computing an XOR of parity bits generated from stored data bits with stored parity bits.

18. The one or more non-transitory computer-readable media as recited in claim 15, wherein the multi-dimensional array is a two-dimensional array.

19. The one or more non-transitory computer-readable media as recited in claim 15, wherein the multi-dimensional array is received via a single memory access.

20. The one or more non-transitory computer-readable media as recited in claim 15, further comprising binning the memory device as unusable based at least in part on determining that the number of errors in the second set of data bits is greater than or equal to one.

* * * * *